(12) United States Patent
Djahanshahi et al.

(10) Patent No.: US 9,742,354 B2
(45) Date of Patent: Aug. 22, 2017

(54) VOLTAGE CONTROLLED OSCILLATOR WITH COMMON MODE ADJUSTMENT START-UP

(71) Applicant: Microsemi Solutions (U.S.), Inc., Aliso Viejo, CA (US)

(72) Inventors: Hormoz Djahanshahi, Port Moody (CA); Kenneth Allan Townsend, Vancouver (CA)

(73) Assignee: Microsemi Solutions (U.S.), Inc., Aliso Viejo, CA (US)

( * ) Notice: Subject to any disclaimer, the term of this patent is extended or adjusted under 35 U.S.C. 154(b) by 0 days.

(21) Appl. No.: 15/341,352

(22) Filed: Nov. 2, 2016

(65) Prior Publication Data

US 2017/0054413 A1    Feb. 23, 2017

Related U.S. Application Data

(60) Division of application No. 14/744,756, filed on Jun. 19, 2015, now Pat. No. 9,515,607, which is a
(Continued)

(51) Int. Cl.
*H03B 5/04*    (2006.01)
*H03B 5/06*    (2006.01)
(Continued)

(52) U.S. Cl.
CPC ............ *H03B 5/1293* (2013.01); *H03B 5/04* (2013.01); *H03B 5/06* (2013.01); *H03B 5/124* (2013.01);
(Continued)

(58) Field of Classification Search
CPC ... H03B 5/00; H03B 5/04; H03B 5/06; H03B 5/08; H03B 5/12; H03B 5/1206; H03B 5/1209; H03B 5/1212; H03B 5/1215; H03B 5/1228; H03B 5/1231; H03B 5/1234; H03B 5/1271; H03B 5/1275; H03B 5/1278;
(Continued)

(56) References Cited

U.S. PATENT DOCUMENTS 6,268,777 B1    7/2001 Welch
6,362,698 B1    3/2002 Gupta
(Continued)

FOREIGN PATENT DOCUMENTS

WO    2008035035 A1    3/2008

OTHER PUBLICATIONS

Craninckx et al., "A Fully Integrated Spiral-LC CMOS VCO Set with Prescaler for GSM and DCS-1800 Systems," IEEE 1997 Custom Integrated Circuits Conference, May 1997, pp. 403-406.
(Continued)

*Primary Examiner* — Levi Gannon
(74) *Attorney, Agent, or Firm* — Dennis R. Haszko

(57) ABSTRACT

The present disclosure provides methods and apparatus for dynamically adjusting the common mode voltage at the LC tank node and/or the power supply voltage of a VCO with an LC resonator in order to force oscillation start-up by temporarily increasing gain. Methods according to certain preferred embodiments may reduce power consumption and/or overcome threshold voltage limitations and/or increase frequency and frequency tuning range during normal (steady-state) operation.

20 Claims, 6 Drawing Sheets

Related U.S. Application Data continuation of application No. 14/160,375, filed on Jan. 21, 2014, now Pat. No. 9,083,349.

(51) Int. Cl.
 *H03B 5/12*     (2006.01)
 *H03L 1/00*     (2006.01)
 *H03L 3/00*     (2006.01)
 *H03L 5/00*     (2006.01)
 *H03L 7/099*     (2006.01)
 *H03K 3/03*     (2006.01)

(52) U.S. Cl.
 CPC ........... *H03B 5/129* (2013.01); *H03B 5/1212* (2013.01); *H03B 5/1228* (2013.01); *H03B 5/1234* (2013.01); *H03B 5/1278* (2013.01); *H03K 3/0315* (2013.01); *H03L 1/00* (2013.01); *H03L 3/00* (2013.01); *H03L 5/00* (2013.01); *H03L 7/099* (2013.01); *H03B 2200/0094* (2013.01)

(58) Field of Classification Search
 CPC ................. H03B 5/129; H03B 5/1293; H03B 2200/0094; H03L 1/00; H03L 3/00; H03L 5/00
 USPC ........ 331/15, 109, 117 FE, 117 R, 167, 172, 331/173, 182, 183, 185, 186
See application file for complete search history.

(56) References Cited

U.S. PATENT DOCUMENTS

| | | |
|---|---|---|
| 7,479,839 B1 | 1/2009 | Kossel et al. |
| 7,880,554 B2 | 2/2011 | Raghunathan et al. |
| 7,961,056 B2 * | 6/2011 | Taylor ...................... H03L 5/00 331/117 FE |
| 7,978,017 B2 | 7/2011 | Pernia et al. |
| 8,269,566 B2 | 9/2012 | Upadhyaya et al. |
| 8,629,730 B2 | 1/2014 | Nemoto et al. |
| 8,723,610 B2 | 5/2014 | Cao |
| 8,816,790 B2 | 8/2014 | Sinoussi |
| 2009/0237168 A1 | 9/2009 | Wilson |
| 2009/0289732 A1 | 11/2009 | Miyashita |
| 2011/0032042 A1 * | 2/2011 | Athas ...................... H02M 3/07 331/117 FE |
| 2012/0326762 A1 | 12/2012 | Sakai et al. |
| 2015/0145607 A1 | 5/2015 | Caffee |

OTHER PUBLICATIONS

Hajimiri et al., "Design Issues in CMOS Differential LC Oscillators," IEEE Journal of Solid-State Circuits, vol. 34, No. 5, May 1999, pp. 717-724.

U.S. Appl. No. 14/744,756 Notice of Allowance dated Aug. 17, 2016.

U.S. Appl. No. 14/160,375 Office Action dated Dec. 5, 2014.

\* cited by examiner

VOLTAGE CONTROLLED OSCILLATOR WITH COMMON MODE ADJUSTMENT START-UP

CROSS REFERENCE TO RELATED APPLICATIONS

This application is a divisional application of U.S. patent application Ser. No. 14/744,756, filed Jun. 19, 2015, which is a continuation application of U.S. patent application Ser. No. 14/160,375 filed Jan. 21, 2014 and entitled VOLTAGE CONTROLLED OSCILLATOR WITH COMMON MODE ADJUSTMENT START-UP, which are hereby incorporated by reference.

TECHNICAL FIELD

The present disclosure relates to voltage controlled oscillators (VCOs) and a method of and an apparatus for operating a VCO. In particular, it relates to a VCO and a method of dynamically adjusting the common mode voltage at the LC tank node and/or the power supply voltage of a VCO with an LC resonator in order to force oscillation start-up by temporarily increasing gain, thereby reducing power consumption and/or overcoming threshold voltage limitations and/or increasing the frequency and frequency tuning range during normal (steady-state) operation.

BACKGROUND

The Phase Locked Loops (PLLs) in general, and a special class of PLLs known as Clock Synthesizer Units (CSUs), require Voltage Controlled Oscillators (VCOs) to generate an output clock signal, where the frequency of the output clock signal is proportional to an input control voltage. The VCO must start-up reliably in order to guarantee CSU stability in the steady-state. Failure of the VCO to start-up reliably will result in a non-functional PLL/CSU.

One known method of implementing a VCO is the complementary cross-coupled LC-oscillator, described by Craninckx et al, in, "A fully integrated spiral-LC CMOS VCO set with prescaler for GSM and DCS-1800 systems," in Proc. IEEE Custom Integrated Circuits Conference (CICC), May 1997, pp. 403-406. A phase noise analysis of this type of VCO was carried out by Hajimiri et al. in, "Design Issues in CMOS Differential LC Oscillators," in J. Solid-State Circuits, Vol. 34, No. 5, May 1999, pp. 717-724. Hajimiri et al. showed that this type of oscillator offers a number of advantages over NMOS-only or PMOS-only structures, including: higher transconductance ($g_m$) for a given current and therefore faster switching, and better rise- and fall-time symmetry resulting in a smaller $1/f^3$ flicker phase noise with lower flicker corner frequency. Given these advantages, the VCO core described in the above papers is used for the present invention, though it should be noted that the invention could be used with other architectures.

FIG. 1 is a diagram showing the architecture of an example of a well known complementary cross-coupled LC VCO 10, as described in the references above. The example VCO 10 includes a cross-coupled pair of PMOS transistors 11 and 12, and a cross-coupled pair of NMOS transistors 13 and 14. The cross-coupled transistor devices 11, 12, 13 and 14 set the common mode voltage, $V_{CM}=(V_++V_-)/2$. Ideally, the devices are well matched and common mode voltage is equivalent to half the supply voltage (i.e. $V_{CM}=V_{DD}/2$ in FIG. 1). Frequency selectivity is provided by a fixed inductor (L) 15 and a variable capacitor (C) 16, where the capacitor is controlled using analog voltage and/or digital selection. The inductor 15 and capacitor 16 are sometimes referred to as the "LC tank".

The gain of cross-coupled devices 11-14 must be sufficiently large to guarantee start-up of the VCO. Gain is dependent on device transconductance, which in turn is proportional to device width (W) and gate overdrive-voltage, where overdrive-voltage is the voltage between gate and source in excess of the transistor threshold (turn-on) voltage. Once steady-state has been reached in the LC VCO, only a small amount of energy need be injected each cycle to compensate for tank losses.

In low-voltage deep submicron CMOS technologies, circuit power reduction is often achieved by reducing supply voltage. In traditional CMOS technology scaling, the reduction in power supply voltage is assumed to be accompanied by a reduction in device threshold voltage. More recently, however, when device feature sizes (mainly minimum channel length $L_{min}$) shrink in each new generation of CMOS technology the device threshold voltages may be held steady or increased slightly to further reduce power drawn from the supply, reduce power wasted by drain-source leakage in the off-state, and improve digital circuit noise margin. As a consequence, the supply voltage for a complementary cross-coupled VCO will have a lower limit determined by the fact that the common mode voltage across balanced complementary PMOS or NMOS pairs must be at least equal to the corresponding transistor threshold voltage(s) to avoid significant reductions in device transconductance, and in turn decreases in regenerative loop gain in a VCO such that the gain is no longer sufficient to guarantee the oscillation start-up.

To overcome this limitation, alternative VCO architectures may be used. For example, an NMOS-only (or PMOS-only) VCO structure does not require a half-supply common mode voltage, offering more flexibility in design. However, the use of this type of VCO means the advantages listed above for the complementary cross-coupled structure are lost. Moreover, the remaining NMOS (or PMOS) transistors in the circuit can be subject to electrical over-stress (EOS) of voltage, a condition that will degrade long-term reliability and lifetime of the device.

Transconductance can be increased somewhat by increasing device width (W), but the impact of increasing width is diminished when common mode voltage across PMOS or NMOS pair is less than the corresponding transistor threshold voltage, as devices in this case will be biased in the sub-threshold regime. At the same time, increasing width adds additional capacitive parasitics to the VCO tank, thereby reducing frequency tuning range and/or reducing maximum oscillating frequency of the VCO.

The inventors have determined a need for methods and apparatus for increasing the robustness of oscillation start-up reliability without impacting VCO frequency tuning range and in which the advantages of the cross-coupled VCO are retained.

SUMMARY

The present disclosure provides methods and apparatus for dynamically adjusting the common mode voltage at the LC tank node and/or the power supply voltage of a VCO with an LC resonator in order to force oscillation start-up by temporarily increasing gain. Methods according to certain preferred embodiments may reduce power consumption and/or overcome threshold voltage limitations during normal (steady-state) operation.

One aspect provides a method of controlling a voltage controlled oscillator (VCO) having an LC tank and at least one pair of transistors cross-coupled across a pair of common nodes of the LC tank, with a drain of one transistor of the pair and a gate of the other transistor of the pair connected to one of the pair of common nodes of the LC tank, and a gate of the one transistor of the pair and a drain of the other transistor of the pair of transistors connected to the other of the pair of common nodes of the LC tank. The method comprises providing a supply voltage to the VCO such that a voltage difference between a common mode voltage at the pair of common nodes and a source voltage of transistors of the pair of transistors is less than a threshold voltage of the transistors of the pair of transistors; temporarily adjusting the common mode voltage to increase the voltage difference and initiate oscillation in the VCO at the common nodes; and, during steady-state oscillation, powering the VCO with the supply voltage.

Another aspect provides an apparatus comprising a voltage controlled oscillator (VCO) having an LC tank and at least one pair of transistors cross-coupled across a pair of common nodes of the LC tank, with a drain of one transistor of the pair and a gate of the other transistor of the pair connected to one of the pair of common nodes of the LC tank, and a gate of the one transistor of the pair and a drain of the other transistor of the pair of transistors connected to the other of the pair of common nodes of the LC tank. A supply voltage is connected to power the VCO during steady-state oscillation such that a voltage difference between a common mode voltage at the pair of common nodes and a source voltage of transistors of the pair of transistors is less than a threshold voltage of the transistors of the pair of transistors. A control circuit is connected to monitor the pair of common nodes and temporarily adjust the common mode voltage to increase the voltage difference and initiate oscillation in the VCO at the common nodes.

Further aspects and details of example embodiments are described below.

DRAWINGS

The following figures set forth embodiments in which like reference numerals denote like parts. Embodiments are illustrated by way of example and not by way of limitation in the accompanying figures.

DETAILED DESCRIPTION

The present disclosure enables the construction of voltage controlled oscillators that demonstrate robust start-up in the presence of unwanted Process, Voltage, and Temperature (PVT) variations by providing mechanisms to guarantee oscillator start-up using a method that has little impact on oscillator device sizing, frequency, phase noise, or power consumption during normal steady-state operation. The following describes methods and apparatus for increasing the regenerative loop gain of a complementary cross-coupled VCO during start-up. This may be accomplished by temporarily adjusting the VCO's common mode voltage and/or power supply voltage and/or bias current. Once the VCO is in steady-state oscillation, the nominal steady-state common mode voltage across the transistor pair can be less than the threshold voltage of the transistors, since at least part of each oscillation will result in an instantaneous voltage across the transistors sufficient to enable conduction.

When implemented in a CMOS integrated circuit (IC) technology, the gain boosted during start-up makes it possible for either (a) the use of PMOS/NMOS transistors with smaller width and/or higher threshold voltage, (b) reduced power supply voltage during steady-state operation, or (c) a combination of these features. This can save power and increase the Frequency Tuning Range (FTR) of the VCO. This method does not impact the oscillator's frequency or phase noise during normal (steady-state) operation.

Some embodiments provide a voltage-controlled oscillator that consists of a complementary differential cross-coupled oscillator core, an inductor, a digitally programmable capacitor, and a voltage-controlled variable capacitor (varactor). A control circuit forces a temporary common mode and/or differential voltage change (i.e. increase or decrease) in the oscillator core, for example by utilizing weak pull-up and/or pull-down transistor devices.

Figure 1:
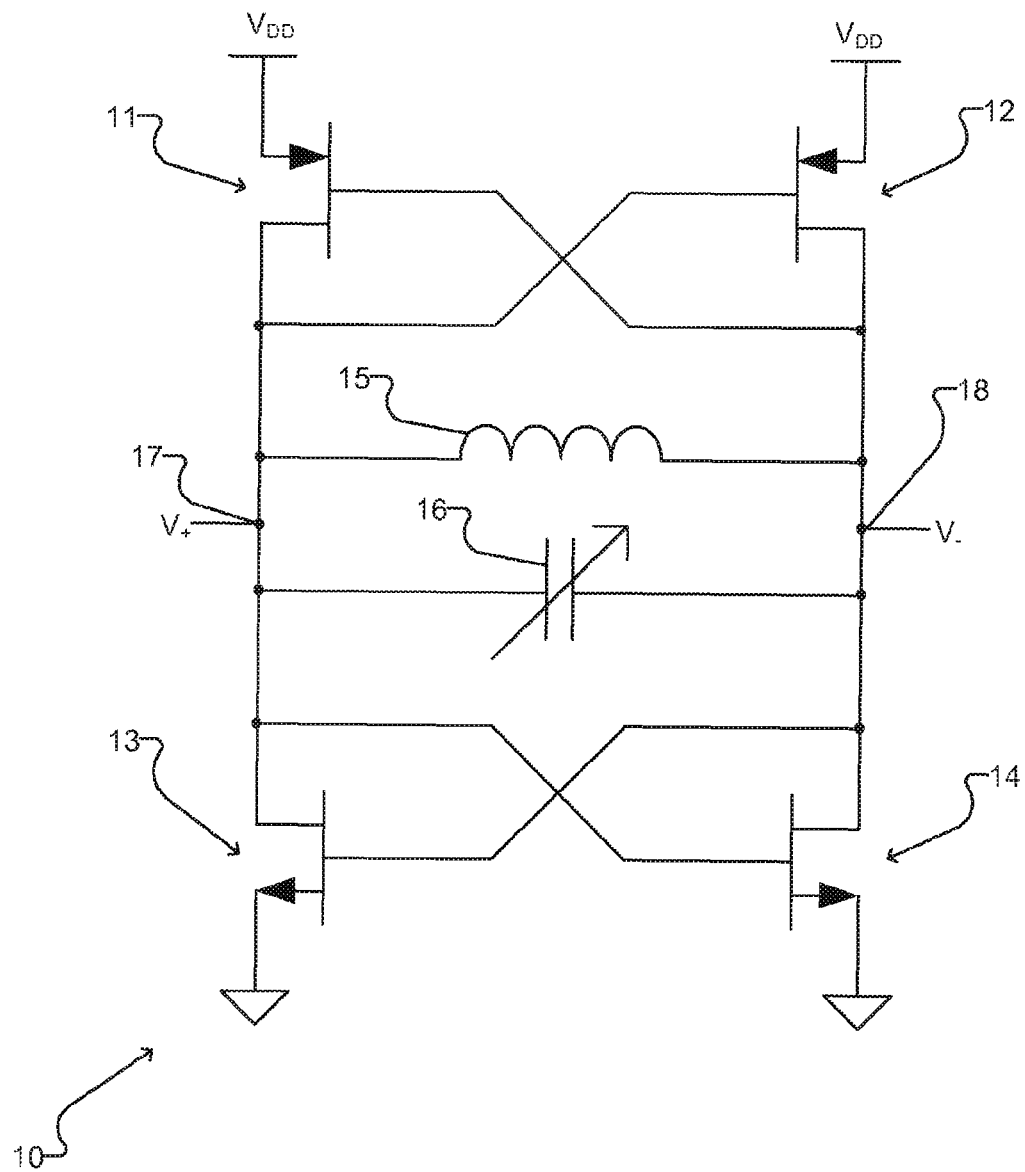
FIG. 1 shows a complementary cross-coupled VCO according to the prior art.

Methods according to preferred embodiments can advantageously be used to change the common mode level at the VCO signal terminals such that common mode voltage across the cross-coupled NMOS and/or PMOS pair(s) exceeds the threshold voltage of the corresponding transistor devices. This increases transconductance of the respective devices, and in turn their gain, such that the VCO will start up even when the threshold voltage is greater than the nominal steady-state common mode voltage across the transistor pair (e.g., half the supply voltage in a VCO having an architecture like FIG. 1). Once in steady-state, the forcing voltage is removed and the common mode voltage returns to its original sub-threshold level. However, given the oscillator is now oscillating in steady-state, each oscillation cycle will present for some percentage of the period an instantaneous voltage across the transistor device(s) large enough to enable conduction and thus inject energy back into the LC tank to compensate for losses, hence sustaining the oscillation.

This increased robustness is critical when designing in advanced deep-submicron digital processes with small geometries, such as 28 nm CMOS and below, as the lowest cost and most resilient digital devices in these technologies exhibit relatively large threshold voltages that would otherwise prevent VCO start-up. In addition, the proposed temporary shift in common mode voltage to increase start-up gain circumvents the need for larger core transistors and/or a higher supply voltage. Avoiding larger transistors helps reduce parasitic capacitance loading on the LC tank and hence increases the VCO frequency and frequency tuning range. Avoiding higher supply voltages helps reduce the power consumption in a low-power design.

Another advantage of methods and circuits according to certain embodiments is that the common mode adjustment can be tailored to process-specific threshold voltages. For example, if in a given device fabrication lot the process variation causes the threshold voltage of the PMOS transistors to be significantly greater than that of the NMOS transistors, a downward pulse with optimum voltage level (i.e. a temporary decrease in common-mode voltage $V_{CM}$) should be most suitable to increase start-up gain by increasing PMOS gate-source voltage. Alternatively, if in a given device fabrication lot the threshold voltage of the NMOS is greater than the PMOS then an upward pulse with optimum voltage level (i.e. a temporary increase in common-mode voltage $V_{CM}$) should be more suitable for the oscillation start-up by increasing NMOS gate-source voltage.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

Figure 2:
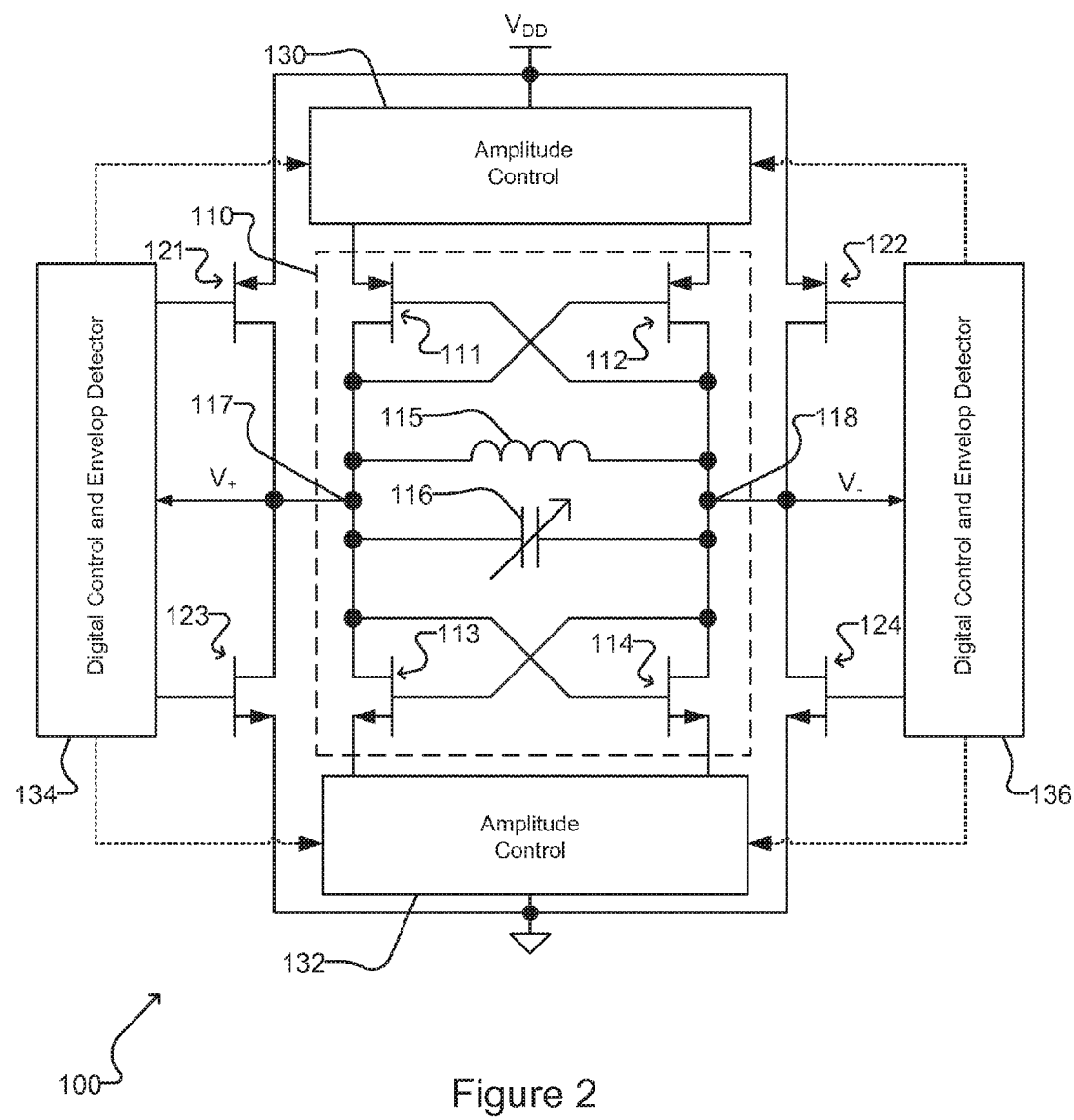
FIG. 2 shows a complementary cross-coupled VCO with common mode adjustment according to one embodiment.

FIG. 2 shows an example circuit 200 according to one embodiment, which is implemented as a complementary cross-coupled LC-VCO with pull-up/pull-down devices for common mode adjustment and/or gain boosting. The differential VCO core 110 comprises transistors 111, 112, 113 and 114, which generate negative resistance required for oscillation that cancels out positive resistance associated with losses in the LC tank 115, 116. Switching devices 111, 112 and 113, 114 are the PMOS and NMOS halves of the VCO respectively, and each set forms a cross-coupled pair connected between common nodes 117 and 118. The input impedance of these cross-coupled pairs exhibits an equivalent negative resistance, whose absolute value is inversely proportional to their respective transconductance $g_m$.

The VCO output signals at the nodes 117 and 118 are differential, with $V_+$ the positive output terminal of the VCO and V the negative output terminal of the VCO. As described earlier, the common mode level of the VCO core 110, $V_{CM}=(V_++V_-)$, is set by the relative sizing of the PMOS and NMOS switching devices and by the bias current in the core. The current in the VCO core 110 is optionally set by gain control circuitry (e.g. amplitude control blocks 130 and 132). For optimum VCO phase noise performance the common mode voltage is approximately half the supply voltage, or half the supply voltage less the voltage drop across of the amplitude control circuitry 130 or 132.

The inductor 115 and variable capacitor 116 form the VCO's frequency-selective tank. The inductor 115 is preferably, but not necessarily, symmetrical. The variable capacitor 116 is preferably, but not necessarily, a combination of digitally programmable fixed capacitances and continuously variable capacitors (varactors).

A pair of pull-up transistors 121 and 122 are connected between voltage terminals $V_+$ and $V_-$ and $V_{DD}$, and a pair of pull-down transistors 123 and 124 are connected between voltage terminals $V_+$ and $V_-$ and ground. During steady-state operation, these devices 121-124 are turned off and consume no power. Devices 121-124 are preferably sized to minimize the impact of parasitic capacitance on VCO frequency tuning range. The pull-up/pull-down combination is also sized to balance loading on $V_+$ and $V_-$. Metal connection to the drain terminal of these devices is minimized to offer low parasitic loading impact on the LC tank. Various considerations may be taken into account to determine suitable sizes for devices 121-124, depending on the situation. For example, the larger the size of the pull-up/pull-down devices 121-124, the larger the DC current will be through the devices, and the larger the DC current, the larger the magnitude of the shift in common mode voltage. The devices 121-124 are preferably only large enough to shift the common mode voltage by the appropriate amount (the appropriate amount being enough to start up the oscillation and no more). Any additional shift in common mode is unnecessary. Further, the devices 121-124 are preferably sized large enough to ensure that the DC/AC current though the devices during start-up does not exceed reliability limits (too much current in a device that is too small could lead to damage and degrade the lifetime of the transistor).

Each of the transistors 121-124 may be a single device, or a combination of a plurality of parallel devices. When a combination of parallel devices is used, multiple control signals are applied to each of 121-124 so that the magnitude of common mode voltage change at $V_+$ and $V_-$ are more finely controllable. Equivalent 'on' resistance of these devices is preferably small enough to provide a significant common mode shift but large enough not to degrade LC tank quality factor (Q) to the point where no oscillation can occur.

Gate voltages for the pull-up/pull-down devices 121-124 are provided by digital control and envelope detectors 134 and 136. These detectors 134, 136 generate the up/down control signals that drive the pull-up/pull-down devices to 'on' and 'off' states to fulfill the required common mode adjustment during the start-up sequence. The digital control and envelope detectors 134 and 136 may comprise, for example, envelope detector circuits which receive the outputs $V_+$ and $V_-$, digital control circuits which provide the gate voltages for the pull-up/pull-down devices 121-124, and optionally additional control signals to the amplitude control circuitry 130 and 132, as indicated by the dotted lines in FIG. 2. The digital control and envelope detectors 134 and 136 may also optionally be coupled to process monitor blocks and/or duty cycle distortion monitor blocks. The digital control and envelope detectors 134 and 136 may, for example, interact with process monitor blocks that provide information about the process technology operates, e.g. how threshold voltage or switching speed of the implemented PMOS/NMOS transistors compare to those in a typical process. In some embodiments, the digital control and envelope detectors 134 and 136 may interact with ring oscillators to provide information about the speed of NMOS and PMOS transistors implemented in the same process on the same chip common to the VCO. For example, some embodiments may utilize process monitors comprising ring oscillators made of the same type of PMOS and NMOS transistors as in the VCO. In other embodiments, the digital control and envelope detectors 134 and 136 may interact with other types of process monitoring circuits.

The two outputs $V_+$ and $V_-$ are also applied to the digital control and envelope detectors 134, 136. The envelope detector circuits determine the amplitude of the VCO output. Digital control logic uses the envelope detector information concerning the VCO amplitude to determine when oscillation has reliably been established in order to disable common mode adjustment circuitry. Alternatively, the control logic may adjust common mode voltage for a prescribed time in a prescribed direction that is known based on, for example, off-line testing or a priori analysis and simulation of NMOS and PMOS process corners to ensure reliable VCO start-up.

If desired, devices 121-124 can be configured to perform a useful but optional secondary function. Mismatch in core devices 111-114 and/or tank capacitance 116 may result in a small DC differential offset between $V_+$ and $V_-$ that should ideally be zero and/or a common mode voltage that is not optimally placed at one half the supply voltage. In some embodiments, the digital control and envelope detectors 134 and 136 are configured to detect any duty cycle distortion (DCD), or other parameters such as, for example, average voltage level (DC component), to detect imbalance in the signals at $V_+/V_-$. Some combination of the pull-up/pull-down devices 121-124 connected across the common nodes 117 and 118 to $V_+/V_-$ can be enabled to adjust the DC voltage at $V_+/V_-$, thereby improving the match between the rise and fall times of the positive and negative output signals and/or the match between complementary pairs at the cost of increased power consumption. The amount of adjustment possible would depend on the size of devices 121-124 and/or the frequency shift that can be tolerated while these devices are enabled. Better matching of $V_+/V_-$ also improves common-mode noise rejection, including power supply rejection (PSR). Better symmetry of the rise and fall transitions driven by the PMOS and NMOS transistors improves close-in $1/f^3$ noise, as postulated in the Hajimiri et al. reference noted earlier in the "Background" section.

The amplitude control blocks 130, 132 may be used to reduce VCO power consumption after start-up. When the temporary common mode voltage adjustment operation is underway, the amplitude control blocks 130, 132 can be set to minimize their voltage drop and maximize bias current, aiding in gain enhancement to help start up the oscillation. Alternatively or additionally, the amplitude control blocks 130, 132 can be used in tandem with the envelope detection circuitry 134, 136 during steady-state operation to reduce power consumption and act as a secondary means of common mode voltage control, as indicated by the dotted lines in FIG. 2.

Figure 3:
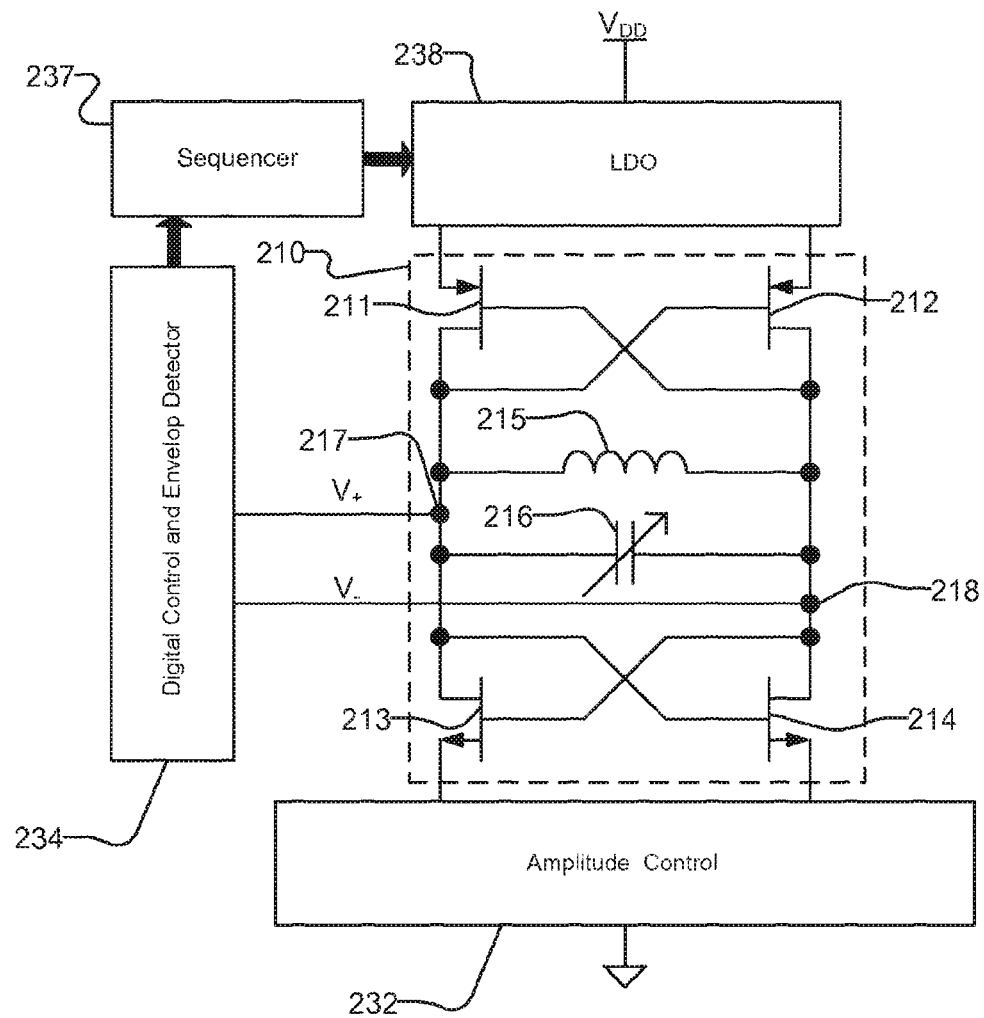
FIG. 3 shows a complementary cross-coupled VCO with common mode adjustment according to another embodiment.

Other embodiments can provide substantially the same functionality using alternative circuitry. FIG. 3 shows an example circuit 200 having a VCO core 210, comprising elements 211-218, which correspond to 111-118 described above, connected to $V_{DD}$ through a programmable low-dropout (LDO) voltage regulator 238. The VCO core 210 is connected to ground through an amplitude control block 232 and the common mode voltage at 217, 218 is provided to a digital control and envelope detector 234. The a digital control and envelope detector 234 may be similar to, the digital control and envelope detectors 134 and 136 discussed above, and similarly optionally interface with process monitor blocks and/or duty cycle distortion monitor blocks as described above. The LDO voltage regulator 238 is controlled by a software and/or firmware and/or hardware sequencer 237 based on signals from the digital control and envelope detector 234 to temporarily shift up the voltage of the power supply to the VCO core 210, and thus common mode voltage at 217, 218, to a level that is sufficient to initiate oscillation. Once steady-state has been established (e.g., after a predetermined time, or based on a determination of stead-state by one or more envelope detector circuits in 234), the LDO voltage regulator 238 returns the power supply voltage to the "normal" low supply-voltage mode to reduce power consumption and prevent long-term Electrical Overstress (EOS) of the transistors 211-214. Because the voltage shift is short-term, long-term reliability and life time of the transistor devices 211-214 are substantially unaffected.

Although the example embodiments of FIGS. 2 and 3 are each implemented with a complementary cross-coupled LC VCO, techniques for pulsing and/or shifting common mode voltage to temporarily increase PMOS and/or NMOS gain could also be applied to other oscillator circuits, for example other LC VCO topologies.

Figure 4A:
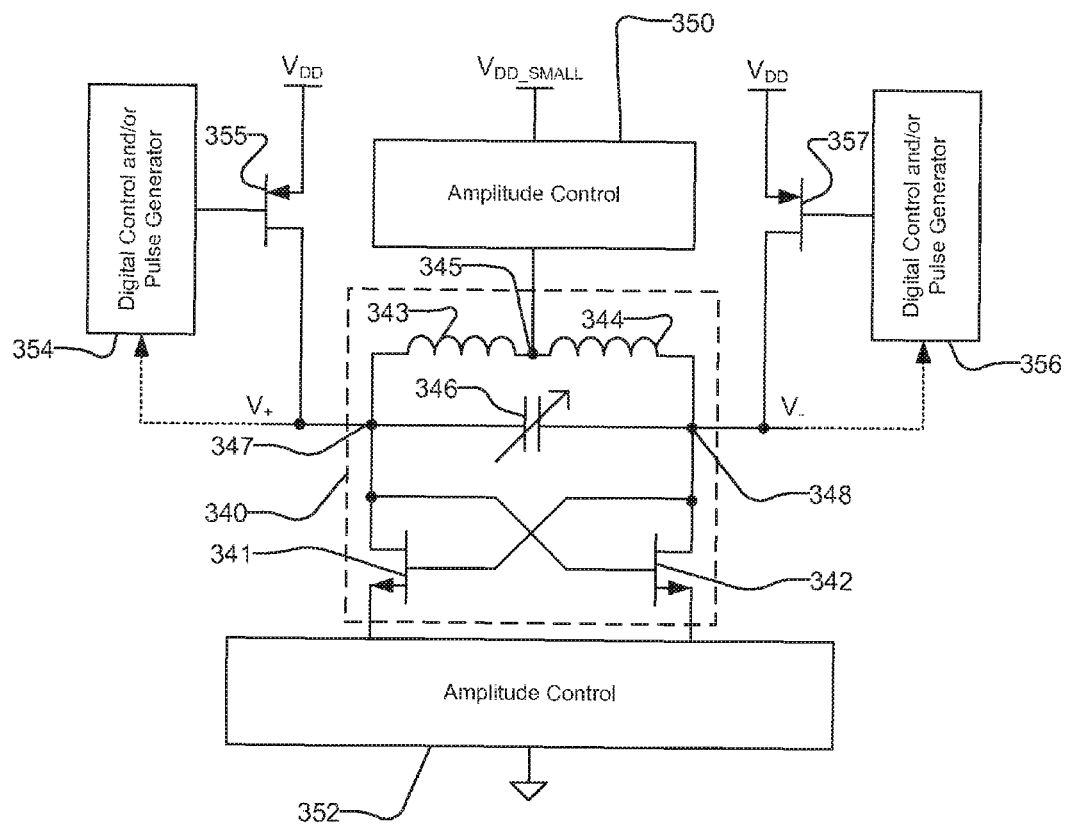
FIG. 4A shows an NMOS-only cross-coupled VCO with common mode adjustment according to another embodiment.

FIG. 4A shows an example circuit 300 having a VCO core 340 comprising a single pair of NMOS transistors 341 and 342 cross-coupled across common nodes 347, 348 of an LC tank comprising inductors 343, 344 and variable capacitor 346. A center tap 345 of the inductors 343, 344 is connected to a steady-state power supply providing a lower voltage (e.g. $V_{DD\_SMALL}$, which may be $V_{DD}/2$ in some embodiments) than a nominal power supply voltage $V_{DD}$ through an amplitude control block 350. The sources of the NMOS devices 341, 342 are connected to ground through another amplitude control block 352. A pair of pull-up transistors 355, 357 are controlled to selectively connect $V_+, V_-$ to $V_{DD}$ by control blocks 354, 356. In some embodiments, $V_+$ and $V_-$ are also provided to the control blocks 354, 356 for monitoring and fine tuning the common mode voltage during steady-state oscillation. For example, some embodiments may measure the average level (DC component) of V+ and V− using any suitable voltage monitor (e.g. an average detector) to determine the common mode voltage and/or voltage on each of V+ and V− so that the control blocks 354, 356 adjust the pull-up transistors to provide any desired fine tuning.

Figure 4B:
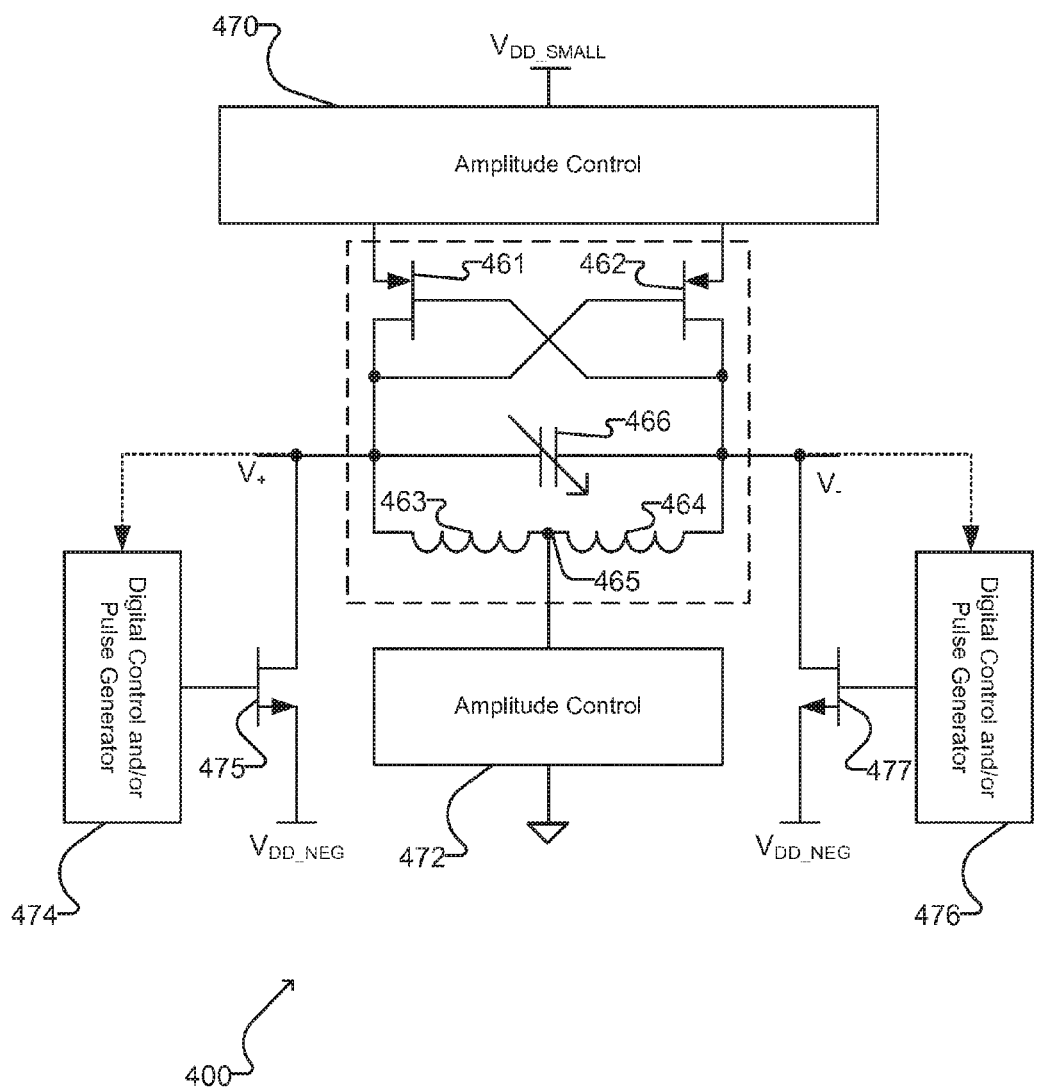
FIG. 4B shows a PMOS-only cross-coupled VCO with common mode adjustment according to another embodiment.

FIG. 4B shows an example circuit 400 having a VCO core 460 comprising a single pair of PMOS transistors 461 and 462 cross-coupled across common nodes 467, 468 of an LC tank comprising inductors 463, 464 and variable capacitor 466. The sources of the PMOS devices 461, 462 are connected to a steady-state power supply providing a lower voltage (e.g. $V_{DD\_SMALL}$, which may be $V_{DD}/2$ in some embodiments) than a nominal power supply voltage $V_{DD}$ through an amplitude control block 470. A center tap 465 of the inductors 463, 464 is connected to ground through another amplitude control block 472. A pair of pull-down transistors 475, 477 are controlled to selectively connect $V_+$, $V_-$ to a negative supply voltage $V_{DD\_NEG}$ by control blocks 354, 356. The negative supply voltage $V_{DD\_NEG}$ may be any voltage level low enough to start the oscillation and or adjust common mode voltage as necessary. In some embodiments, $V_+$ and $V_-$ are also provided to the control blocks 474, 476 for monitoring and fine tuning the common mode voltage during steady-state oscillation. For example, some embodiments may measure the average level (DC component) of V+ and V− using any suitable voltage monitor (e.g. an average detector) to determine the common mode voltage and/or voltage on each of V+ and V− so that the control blocks 474, 476 adjust the pull-down transistors to provide any desired fine tuning.

Figure 5:
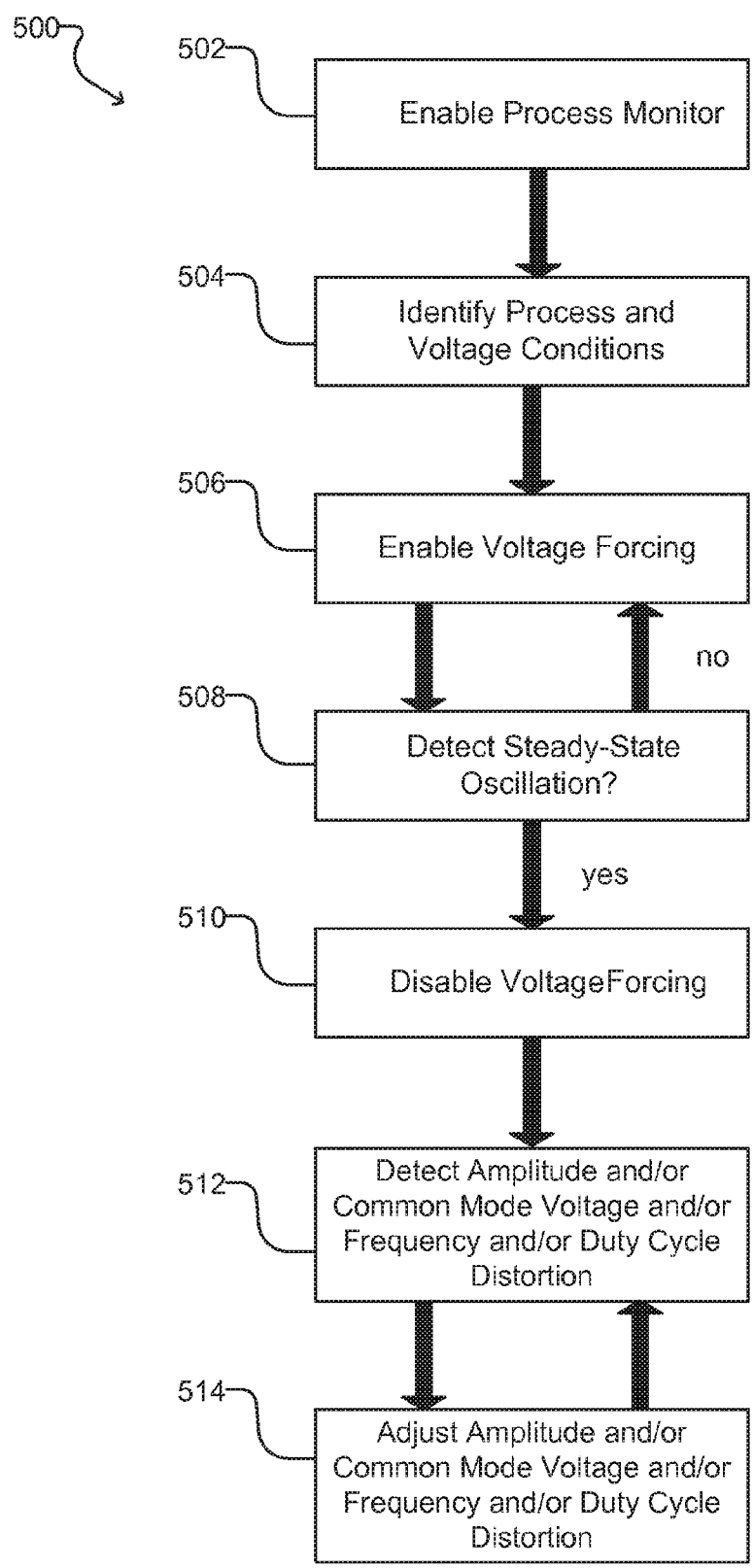
FIG. 5 is a flowchart illustrating a method of controlling a complementary cross-coupled VCO with common mode adjustment according to one embodiment.

FIG. 5 shows an example method 500 that may be carried out by a hardware and/or firmware and/or software sequencer to execute the series of operations required to initiate oscillation and detect steady-state. A process monitor is first enabled 502. The process monitor may be but is not necessarily NMOS-only and/or PMOS-only ring oscillator(s). In some embodiments, ring oscillator frequency is measured and compared against predetermined values. Other embodiments may measure and compare other parameters, e.g. threshold voltages of NMOS and PMOS transistors, to determine process and voltage conditions. The result of this comparison is used to identify 504 the transistor process and voltage characteristics (i.e. fast, slow, or typical, respectively, corresponding to processes with lower than nominal, higher than nominal, or nominal threshold voltage for MOS transistors). In implementations using both PMOS and NMOS transistors, process characteristics are identified 504 for each of the PMOS and NMOS transistor types. Based on the identified process characteristics, the appropriate common mode and/or differential voltage is forced 506 to temporarily increase PMOS and/or NMOS transconductance gain. Common mode voltage forcing 506 continues to be enabled until steady-state oscillation is detected 508, at which point voltage forcing is disabled 510 and the VCO enters normal operation. During normal operation, the VCO amplitude and/or common mode voltage and/or frequency and/or duty cycle distortion is optionally continuously detected 512 and adjusted 514 to maintain desired performance and/or functionality.

Example applications: Circuits and methods according to the present disclosure may be implemented in any system that uses a CSU or PLL to generate a clock signal, including but not limited to RF applications, telecommunication and data transmission applications, and digital signal processing applications. Certain embodiments provide one or more of following advantages in such applications:

The option to reduce cost in CSU or PLL systems by eliminating the need to use low-voltage threshold (LVT) or ultra-low-voltage threshold (ULVT) devices in CMOS technology nodes that offer these device options at an increased mask price over standard threshold voltage (SVT) devices.

The ability to improve VCO start-up with respect to robustness and/or faster starting time in technology nodes where device threshold voltages are such that oscillator loop gain is too low to reliably enter steady-state operation across all process, voltage, and temperature (PVT) corners.

The ability to improve the reliability of VCO start-up without the need to increase loop gain by increasing transistor device size (width), thus minimizing parasitic capacitance and maximizing VCO frequency and frequency tuning range (FTR).

The ability to improve the reliability of VCO start-up without the need to increase loop gain by increasing transistor device size (width) and/or bias current, thus saving power.

The ability to improve the reliability of VCO start-up without the need to increase supply voltage at steady-state operation, thus saving power. This translates to cost saving in mobile and/or battery-operated applications, when battery size (capacity and/or nominal voltage) can be reduced.

Circuits designed according to some embodiments allow significant reduction in the cost of producing large Clock Synthesizer systems that contain one or more PLLs, or in other LC oscillator applications, by removing the need for low-voltage threshold or ultra-low-voltage threshold PMOS/NMOS transistors in a CMOS process technology, and/or by reducing required power supply voltage and current draw in normal (steady-state) operation.

The above-described embodiments are intended to be examples only. Alterations, modifications and variations can be effected to the particular embodiments by those of skill in the art without departing from the scope, which is defined solely by the claims appended hereto.

The invention claimed is:

1. An apparatus comprising:
   a voltage controlled oscillator (VCO) having an LC tank and at least one pair of transistors cross-coupled across a pair of common nodes of the LC tank, with a drain of one transistor of the pair and a gate of the other transistor of the pair connected to one of the pair of common nodes of the LC tank, and a gate of the one transistor of the pair and a drain of the other transistor of the pair connected to the other of the pair of common nodes of the LC tank;
   a power supply system comprising a voltage supply coupled to a low-dropout (LDO) voltage regulator;
   a control circuit coupled to monitor the pair of common nodes, the control circuit comprising:
      a sequencer coupled to the LDO voltage regulator to control the LDO voltage regulator to:
         provide a first supply voltage to the VCO such that a voltage difference between a common mode voltage at the pair of common nodes and a source voltage of transistors of the pair of transistors is less than a threshold voltage of the transistors of the pair of transistors;
         provide a second supply voltage higher than the first supply voltage to the VCO to temporarily adjust the common mode voltage to increase the voltage difference and initiate differential oscillation in the VCO at the common nodes, the second supply voltage being provided until the control circuit determines steady-state oscillation is established; and
         provide the first supply voltage to the VCO once the control circuit determines steady-state oscillation is established thereby reducing power consumption while sustaining the oscillation.

2. An apparatus according to claim 1, wherein the control circuit further comprises a process monitor coupled to detect process and voltage conditions at the common nodes of the VCO, the process monitor also coupled to the sequencer.

3. An apparatus according to claim 2, wherein the VCO comprises two complementary pairs of cross-coupled transistors, with one of the complementary pairs comprising a pair of NMOS transistors and the other of the complementary pairs comprising a pair of PMOS transistors, wherein the control circuit is configured to:
   increase the common mode voltage independently of the LDO voltage regulator in response to the detected process and voltage conditions indicating that the voltage difference is less than a transistor threshold voltage of the pair of NMOS transistors; and
   decrease the common mode voltage independently of the LDO voltage regulator in response to the detected process and voltage conditions indicating that the voltage difference is less than a transistor threshold voltage of the pair of PMOS transistors.

4. An apparatus according to claim 3, wherein the control circuit further comprises:
   a pair of pull-up transistors coupled between the pair of common nodes and a pull-up supply voltage higher than the first supply voltage; and
   a pair of pull-down transistors coupled between the pair of common nodes and one of ground and a negative supply voltage,
   wherein the control circuit is further configured to selectively:
   increase the common mode voltage by selectively activating the pair of pull-up transistors; and
   decrease the common mode voltage by selectively activating the pair of pull-down transistors.

5. An apparatus according to claim 2, wherein the process monitor comprises at least one ring oscillator on an integrated circuit chip common to the VCO, and where the at least one ring oscillator is made of the same type of PMOS and NMOS transistors as in the VCO.

6. An apparatus according to claim 1, wherein the VCO comprises a single pair of NMOS transistors cross-coupled across the common nodes, wherein the first supply voltage is provided by the LDO voltage regulator to a center tap of an inductor of the LC tank, and wherein the control circuit comprises a pair of pull-up transistors coupled between the pair of common nodes and a pull-up supply voltage higher than the first supply voltage.

7. An apparatus according to claim 1, wherein the VCO comprises a single pair of PMOS transistors cross-coupled across the common nodes, wherein the first supply voltage is provided by the LDO voltage regulator to the PMOS transistors, and a center tap of an inductor of the LC tank is grounded while powering the VCO during steady-state oscillation, and wherein the control circuit comprises a pair of pull-down transistors coupled between the pair of common nodes and a negative supply voltage.

8. An apparatus according to claim 1, wherein the control circuit is configured to monitor oscillations at the pair of common nodes during steady-state oscillation and adjust the common mode voltage to improve matching of rising and falling transitions of signals at the pair of common nodes.

9. An apparatus according to claim 1, wherein the control circuit is configured to adjust the common mode voltage for a predetermined time period and to a predetermined voltage level when temporarily adjusting the common mode voltage.

10. An apparatus according to claim 1, wherein the control circuit is configured to monitor the pair of common nodes, and adjust the common mode voltage and retain the adjusted common mode voltage until steady-state oscillation is detected.

11. A method of controlling a voltage controlled oscillator (VCO) having an LC tank and at least one pair of transistors cross-coupled across a pair of common nodes of the LC tank, with a drain of one transistor of the pair and a gate of the other transistor of the pair connected to one of the pair of common nodes of the LC tank, and a gate of the one transistor of the pair and a drain of the other transistor of the pair connected to the other of the pair of common nodes of the LC tank, the method comprising:
  monitoring the pair of common nodes with a control circuit;
  controlling a low-dropout (LDO) voltage regulator with a sequencer, the controlling comprising:
    providing a first supply voltage to the VCO such that a voltage difference between a common mode voltage at the pair of common nodes and a source voltage of transistors of the pair of transistors is less than a threshold voltage of the transistors of the pair of transistors;
    providing a second supply voltage higher than the first supply voltage to the VCO to temporarily adjust the common mode voltage to increase the voltage difference and initiate differential oscillation in the VCO at the common nodes, the second supply voltage being provided until the control circuit determines steady-state oscillation is established; and
    providing the first supply voltage to the VCO once the control circuit determines steady-state oscillation is established thereby reducing power consumption while sustaining the oscillation.

12. A method according to claim 11, further comprising detecting process and voltage conditions at the common nodes of the VCO with a process monitor.

13. A method according to claim 12, wherein the VCO comprises two complementary pairs of cross-coupled transistors, with one of the complementary pairs comprising a pair of NMOS transistors and the other of the complementary pairs comprising a pair of PMOS transistors, wherein the method further comprises:
  increasing the common mode voltage independently of the LDO voltage regulator in response to the detected process and voltage conditions indicating that the voltage difference is less than a transistor threshold voltage of the pair of NMOS transistors; and
  decreasing the common mode voltage independently of the LDO voltage regulator in response to the detected process and voltage conditions indicating that the voltage difference is less than a transistor threshold voltage of the pair of PMOS transistors.

14. A method according to claim 13, wherein the control circuit comprises:
  a pair of pull-up transistors coupled between the pair of common nodes and a pull-up supply voltage higher than the first supply voltage; and
  a pair of pull-down transistors coupled between the pair of common nodes and one of ground and a negative supply voltage,
  wherein the method further comprises selectively:
  increasing the common mode voltage by selectively activating the pair of pull-up transistors; and
  decreasing the common mode voltage by selectively activating the pair of pull-down transistors.

15. A method according to claim 12, wherein the process monitor comprises at least one ring oscillator on an integrated circuit chip common to the VCO, and where the at least one ring oscillator is made of the same type of PMOS and NMOS transistors as in the VCO.

16. A method according to claim 11, wherein the VCO comprises a single pair of NMOS transistors cross-coupled across the common nodes, wherein the method further comprises providing the first supply voltage by the LDO voltage regulator to a center tap of an inductor of the LC tank, and wherein the control circuit comprises a pair of pull-up transistors coupled between the pair of common nodes and a pull-up supply voltage higher than the first supply voltage.

17. A method according to claim 11, wherein the VCO comprises a single pair of PMOS transistors cross-coupled across the common nodes, wherein the method further comprises providing the first supply voltage by the LDO voltage regulator to the PMOS transistors, and a center tap of an inductor of the LC tank is grounded while powering the VCO during steady-state oscillation, and wherein the control circuit comprises a pair of pull-down transistors coupled between the pair of common nodes and a negative supply voltage.

18. A method according to claim 11, further comprising monitoring oscillations at the pair of common nodes during steady-state oscillation and adjusting the common mode voltage to improve matching of rising and falling transitions of signals at the pair of common nodes.

19. A method according to claim 11, further comprising adjusting the common mode voltage for a predetermined time period and to a predetermined voltage level when temporarily adjusting the common mode voltage.

20. A method according to claim 11, further comprising monitoring the pair of common nodes, and adjusting the common mode voltage and retaining the adjusted common mode voltage until steady-state oscillation is detected.

* * * * *